(12) United States Patent
Chen et al.

(10) Patent No.: US 6,352,938 B2
(45) Date of Patent: *Mar. 5, 2002

(54) METHOD OF REMOVING PHOTORESIST AND REDUCING NATIVE OXIDE IN DUAL DAMASCENE COPPER PROCESS

(75) Inventors: Tong-Yu Chen, Hsinchu; Hsi-Ta Chuang; Chan-Lon Yang, both of Taipei, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/457,561

(22) Filed: Dec. 9, 1999

(51) Int. Cl.⁷ ...................... H01L 21/302; H01L 21/461
(52) U.S. Cl. ...................... 438/725; 438/618; 438/622; 438/687; 438/710; 427/534; 134/1.1
(58) Field of Search .................... 438/689, 710, 438/725, 726, 730, 637, 687, 711, 618, 622; 427/534; 134/1.1

(56) References Cited

U.S. PATENT DOCUMENTS

| | | | | |
|---|---|---|---|---|
| 5,661,083 A | * | 8/1997 | Chen et al. | 438/637 |
| 5,795,831 A | * | 8/1998 | Nakayama et al. | 438/714 |
| 5,939,334 A | * | 8/1999 | Nguyen et al. | 438/689 |
| 5,989,997 A | * | 11/1999 | Lin et al. | 438/622 |
| 6,017,817 A | * | 1/2000 | Chung et al. | 438/637 |
| 6,023,102 A | * | 2/2000 | Nguyen et al. | 257/774 |
| 6,030,901 A | * | 2/2000 | Hopper et al. | 438/711 |
| 6,043,146 A | * | 3/2000 | Watanabe et al. | 438/623 |
| 6,051,508 A | * | 4/2000 | Taskase et al. | 438/724 |
| 6,124,213 A | * | 9/2000 | Usami et al. | 438/710 |
| 6,153,514 A | * | 11/2000 | Wang et al. | 438/640 |
| 6,177,347 B1 | * | 1/2001 | Liu et al. | 438/675 |
| 6,255,217 B1 | * | 7/2001 | Agnello et al. | 438/687 |

FOREIGN PATENT DOCUMENTS

EP 718067 A1 * 6/1996

OTHER PUBLICATIONS

Chang and Sze, ULSI Technology, 1996, The McGraw–Hill Companies, Inc., pp. 394–395.*

* cited by examiner

Primary Examiner—Matthew Smith
Assistant Examiner—Craig P. Lytle
(74) Attorney, Agent, or Firm—Thomas, Kayden, Horstemeyer & Risley

(57) ABSTRACT

A method of manufacturing metallic interconnects. A substrate has a copper line formed therein. An inter-metal dielectric layer is formed over the substrate and the copper line. A patterned photoresist layer is formed over the inter-metal dielectric layer. The inter-metal dielectric layer is etched to form a trench and a contact opening that exposes a portion of the copper line, wherein the contact opening is under the trench. At a low temperature and using a plasma derived from a gaseous mixture $N_2H_2$ ($H_2$:4%)/$O_2$, the photoresist layer is removed. Any copper oxide layer formed on the copper line in the process of removing photoresist material is reduced back to copper using gaseous $N_2H_2$ ($H_2$:4%). A barrier layer conformal to the trench and the contact opening profile is formed. Copper is deposited to form a conformal first copper layer over the trench and the contact opening. Using the first copper layer as a seeding layer, a copper or a copperless electroplating is carried out so that a second copper layer is grown anisotropically over the first copper layer.

30 Claims, 4 Drawing Sheets

METHOD OF REMOVING PHOTORESIST AND REDUCING NATIVE OXIDE IN DUAL DAMASCENE COPPER PROCESS

BACKGROUND OF THE INVENTION

1. Field of the Invention

The present invention relates to a method of manufacturing a semiconductor device. More particularly, the present invention relates to a method of manufacturing metallic interconnects.

2. Description of the Related Art

As the level of integration of integrated circuit devices increases, the number of devices in a silicon chip increases and hence the number of interconnects necessary for linking semiconductor devices also increases. Consequently, integrated circuits, in particular metallic interconnects, are becoming harder to manufacture. In fact, how to produce quality conductive lines with ideal operating properties within the confines of a small contact area is a goal that all semiconductor manufacturers are actively pursuing.

Due to a reduction of line width through miniaturization, current density sustained by each metallic line increases correspondingly. Passing a high current through a narrow conventional aluminum metal line results in electromigration and subsequently leads to a device reliability problem.

To reduce electromigration, especially for sub-micron devices, copper is a better choice of material than aluminum for forming interconnects. Copper has a low resistivity and a higher resistance to electromigration. Moreover, a copper layer can be deposited by chemical vapor deposition or electroplating. However, copper is also highly resistant towards most conventional gaseous etchants, and hence copper lines are difficult to produce by conventional methods. Typically, copper lines are usually manufactured by a dual damascene process.

FIGS. 1A through 1C are schematic cross-sectional views showing the progression of steps in a conventional dual damascene process.

As shown in FIG. 1A, a substrate having a copper line 102 therein is provided. A top surface 102a of the copper line 102 is exposed. An inter-metal dielectric layer 104 is formed over the substrate 100. The inter-metal dielectric layer 104 is formed, for example, by sequentially depositing a silicon oxide, a silicon nitride and a silicon oxide layer over the substrate 100. Silicon oxide and silicon nitride have different etching rates with respect to an etchant. Silicon nitride may also be deposited over the substrate 100 to form a silicon nitride layer prior (not shown) to the formation of the inter-metal dielectric layer 104. This has the advantage of preventing copper atoms from diffusing into the inter-metal dielectric layer 104 leading to device malfunction or undesired bridging between metallic interconnects.

As shown in FIG. 1B, a dual damascene opening consisting of a trench 106 and a contact opening 110 is formed in the inter-metal dielectric layer 104 with the contact opening 110 located under the trench 106. To form the dual damascene opening, a patterned photoresist layer (not shown) is formed over the inter-metal dielectric layer 104. The inter-metal-dielectric layer 104 is etched using the patterned photoresist as an etching mask and the silicon nitride layer as an etching stop layer. Hence, the trench 106 is first formed in the inter-metal dielectric layer 104. The patterned photoresist layer is removed, and then another patterned photoresist layer 108 is formed over the inter-metal dielectric layer 104. Using the patterned photoresist layer 108 as a mask, the inter-metal dielectric layer 104 is etched again to form the contact opening 110 that exposes the surface 102a of the copper line 102.

As shown in FIG. 1C, the photoresist layer 108 is removed by ashing using oxygen plasma. The plasma ashing is carried out at a high temperature with oxygen flowing at a rate of about 2000 to 3000 sccm. Oxygen plasma oxidizes organic molecules inside the photoresist material, which contains carbon (C), hydrogen (H), nitrogen (N) and oxygen (O), into gaseous carbon dioxide ($CO_2$), water ($H_2O$) and nitrogen oxides ($NO_x$). The resulting gaseous products including carbon dioxide, water and nitrogen oxide are pumped away. High temperature is used to facilitate the oxidation of the photoresist material and accelerate photoresist removal.

Typically, the ashing chamber for removing photoresist material is raised to a temperature of about 250° C. However, at such a high temperature, the exposed surface 102a of the copper line 102 is also attacked by oxygen plasma. A portion of the copper near the surface 102a is oxidized into loose cupric oxide ($Cu_2O$) or copper oxide (CuO). Hence, electrical conductivity of the copper line decreases and contact resistance at the contact opening increases.

Although the oxides of copper can be dissolved in an alkali solvent, voids 112 are often formed on the surface 102a of the copper line 102. When a barrier layer and a seed layer are subsequently formed over the exposed sidewalls of the trench 106 and the contact opening 110, these voids 112 will result in a highly irregular profile. The irregular profile creates a high stress in subsequently deposited seeding layer during high temperature annealing, and may lead to an open contact due to surface tension. In a subsequent copper electroplating or copperless electroplating process, no copper adheres to the area where there is a break in the seeding layer. Hence, copper will not grow evenly inside the dual damascene opening, and a high contact resistance will result.

SUMMARY OF THE INVENTION

The invention provides a dual damascene process. A substrate having a copper line therein is provided. An inter-metal dielectric layer is formed over the substrate and the copper line. A patterned photoresist layer is formed over the inter-metal dielectric layer. The inter-metal dielectric layer is etched to from a contact opening and a trench that exposes a portion of the copper line with the contact opening located under the trench. At a low temperature and using $N_2H_2$ ($H_2$:4%)/$O_2$ as a gaseous mixture for producing a plasma, the photoresist layer is removed. Due to the presence of oxygen plasma, a surface layer of copper on the copper line is oxidized into copper oxide. Using the $N_2H_2$ ($H_2$:4%) as a gaseous source, the copper oxide layer on the surface of the copper line is reduced back into copper. A barrier layer conformal to the trench and contact opening profile is formed. Copper is deposited to form a conformal first copper layer over the trench and the contact opening. Using the first copper layer as a seeding layer, a copper or a copperless electroplating is carried out to form a second copper layer. The second copper plug layer includes a trench line and a contact.

This invention also provides a dual damascene process that uses a gaseous mixture $N_2H_2$ ($H_2$:4%)/$O_2$ to produce a plasma for removing photoresist material at a low temperature so that the oxidation of copper on the surface of copper lines is greatly reduced.

This invention also provides a dual damascene process that uses a gas $N_2H_2$ ($H_2$:4%) to reduce the copper oxide formed after the removal of photoresist material back into copper so that lowering of electrical conductivity of metallic interconnects and increase of contact resistance are prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
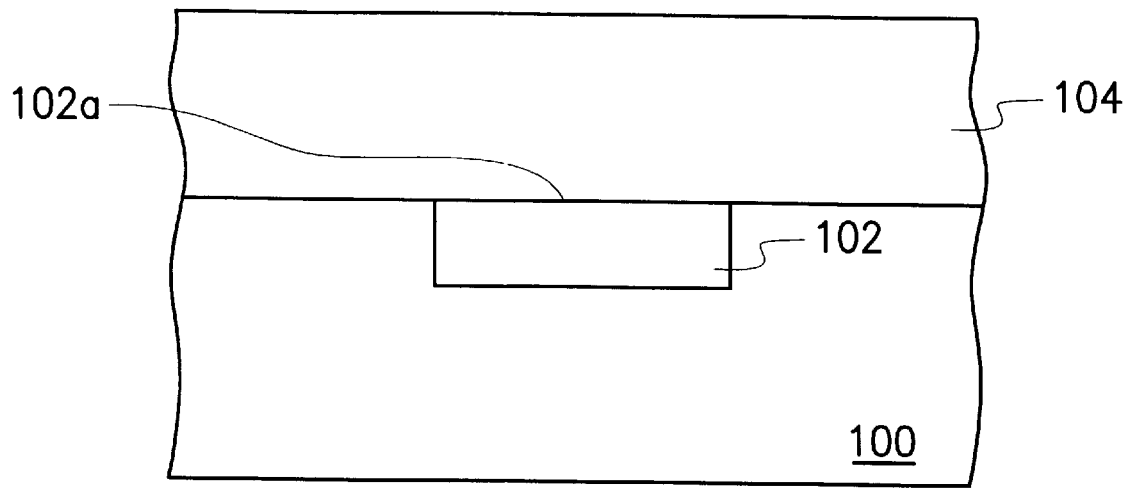
FIGS. 1A through 1C are schematic cross-sectional views showing the progression of steps in a conventional dual damascene process.
Figure 1B:
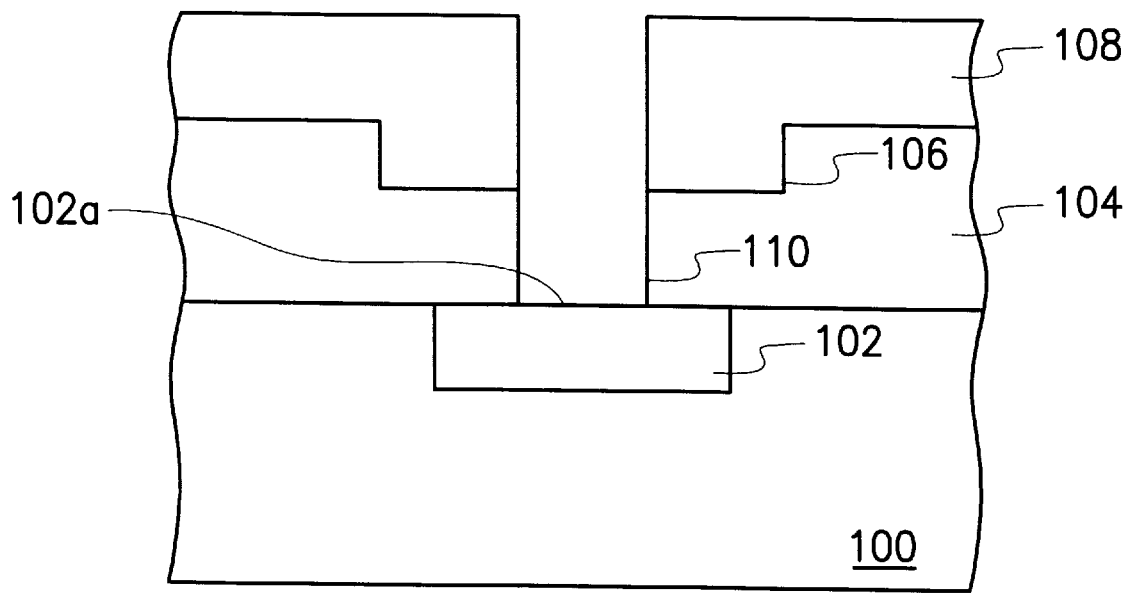
Figure 1C:
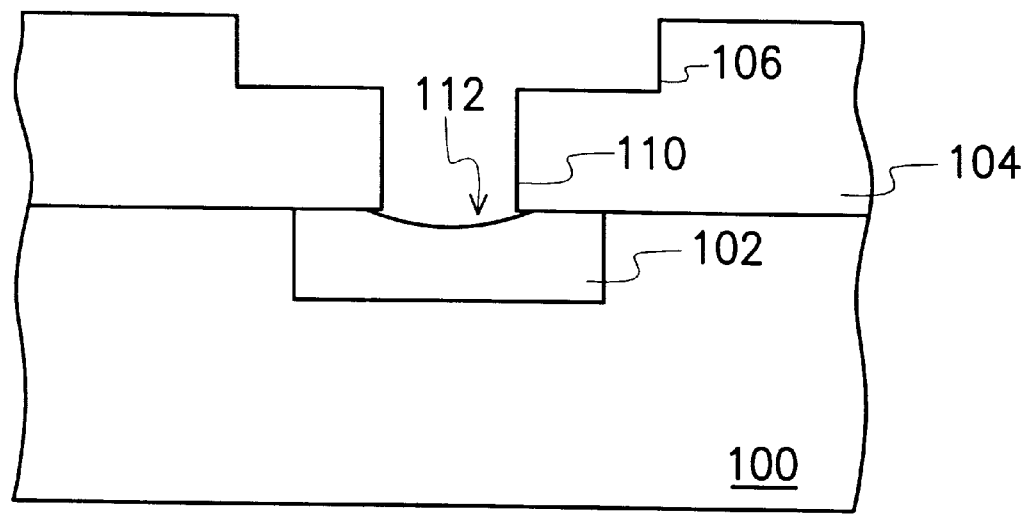

Reference will now be made in detail to the present preferred embodiments of the invention, examples of which are illustrated in the accompanying drawings. Wherever possible, the same reference numbers are used in the drawings and the description to refer to the same or like parts.

Figure 2A:
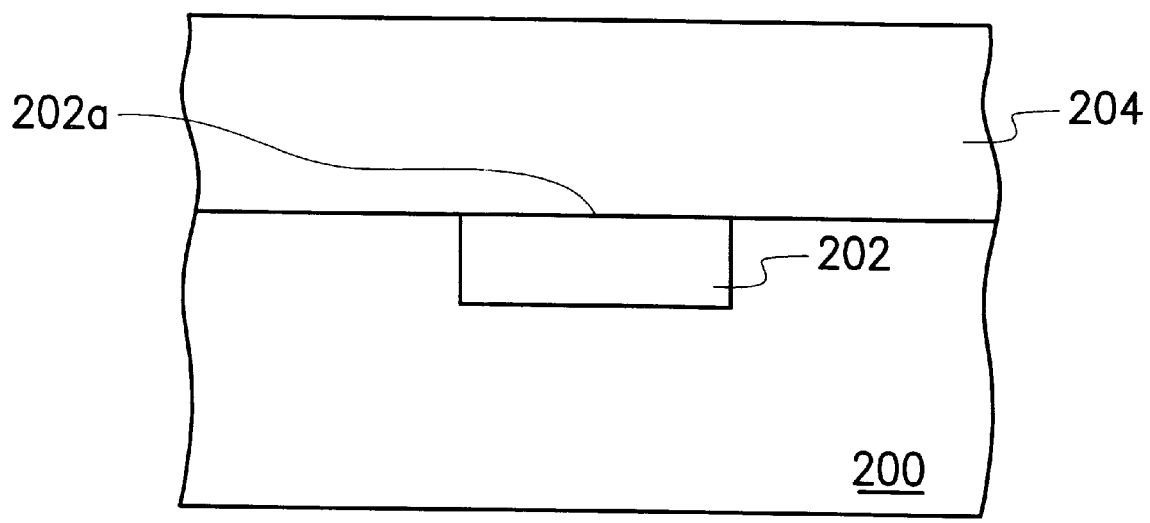
FIGS. 2A through 2D are schematic cross-sectional views showing the progression of steps in a dual damascene process according to the invention.

FIGS. 2A through 2D are schematic cross-sectional views showing the progression of steps in a dual damascene process according to the invention. As shown in FIG. 2A, a substrate 200 having a copper line 202 therein is provided. The upper surface 202a of the copper line 202 is exposed. An inter-metal dielectric layer 204 is formed over the substrate 200 and the copper line 202. The inter-metal dielectric layer 204 is formed, for example, by depositing a silicon oxide layer, a silicon nitride layer and a silicon oxide layer in sequence over the substrate 200. The silicon oxide layer and the silicon nitride layer have different etching rates with respect to a particular etchant. In this embodiment, an additional silicon nitride layer may be formed over the substrate 200 prior to the formation of the inter-metal dielectric layer 204. This silicon nitride layer serves as a barrier preventing the diffusion of copper atoms into the inter-metal dielectric layer 204 that would lead to device malfunction or unwanted bridging between metallic interconnects. The inter-metal dielectric layer 204 is preferably planarized.

Figure 2B:
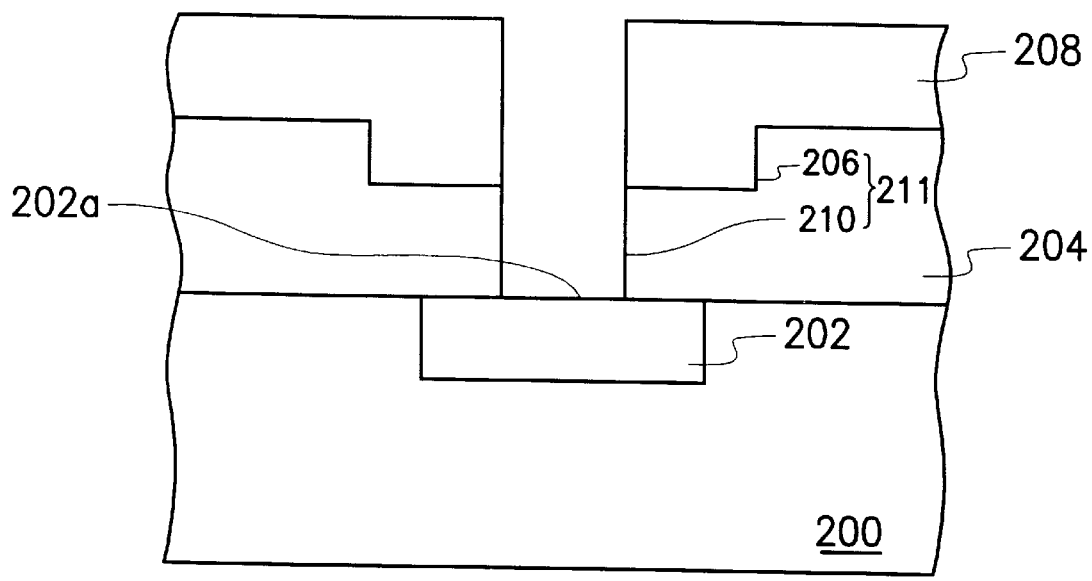

As shown in FIG. 2B, a dual damascene opening 211 is formed in the inter-metal dielectric layer 204. The dual damascene opening 211 includes a trench 206 and a contact opening 210, wherein the contact opening 210 is formed under the trench 206.

Typically, the dual damascene opening 211 is formed by depositing photoresist material over the inter-metal dielectric layer 204 to form a photoresist layer (not shown), and then patterning the photoresist layer. Using the patterned photoresist layer as an etching mask and the silicon nitride layer as an etching stop layer, the inter-metal dielectric layer 204 is etched to form the trench 206. The patterned photoresist layer is removed, and then another patterned photoresist layer 208 is formed over the inter-metal dielectric layer 204. Using the patterned photoresist layer 208 as a mask, the inter-metal dielectric layer 204 is again etched to form the contact opening 210 that exposes the surface 202a of the copper line 202.

The aforementioned method of forming the dual damascene opening 211 is only one of the preferred embodiments of this invention. Alternatively, the contact opening 210 is formed in the inter-metal dielectric layer 204 before the trench 206 is formed. Moreover, the inter-metal dielectric layer 204 can simply be a silicon oxide layer or a low dielectric constant dielectric layer. If the inter-metal dielectric layer 204 is a silicon oxide or a low dielectric constant layer, depth of the trench can be controlled by a timing model. In addition, the method of forming a damascene opening can also be applied to the invention.

Figure 2C:
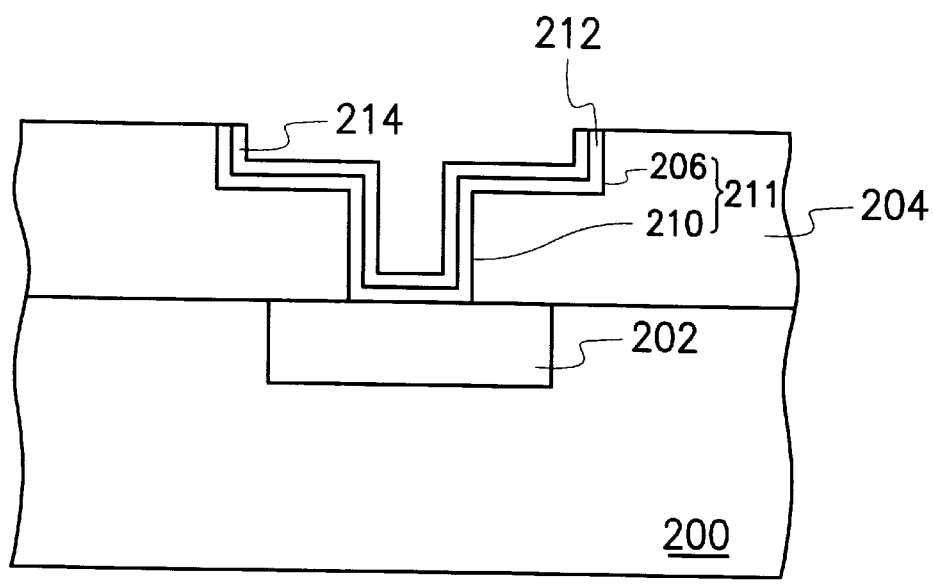

As shown in FIG. 2C, the photoresist 208 is removed by a low-temperature ashing method. In other words, the photoresist layer 208 is removed by placing the substrate 200 in an ashing chamber, introducing $N_2H_2$ at a rate of 100 to 300 sccm and oxygen $O_2$ at a rate of 200 to 600 sccm, heating the chamber to a temperature of about 30 to 90° C., setting the pressure inside the chamber to about 200 to 600 mT, and applying a source power of about 800 to 1300 Watts (2.54 GHz) and a radio frequency (RF) of about 100 to 400 Watts (13.56 MHz). A plasma mixture of $N_2H_2$ ($H_2$:4%)/$O_2$ is produced to carry out low-temperature ashing of the photoresist layer 208.

Although a low-temperature ashing for the removal of the photoresist layer 208 using a plasma mixture of $N_2H_2$ ($H_2$:4%)/$O_2$ can reduce the amount of oxidation of the copper line 202, a portion of copper on the surface 202a still reacts with oxygen plasma to form loose copper oxide leading to a lowering of electrical conductivity of the metal line and an increase in contact resistance. Therefore, after the photoresist layer 208 is removed, the copper oxide on the surface 202a of the copper line 202 is reduced back to copper by the introduction of gaseous $N_2H_2$ into the chamber. Reduction is carried out by introducing $N_2H_2$ (H2:4%) at a rate of 100 to 300 sccm, heating the chamber to a temperature of about 30 to 90° C., setting the pressure inside the chamber to 200 to 600 mT, and applying a source power of about 800 to 1300 Watts (2.54 GHz) and a radio frequency (RF) of about 100 to 400 Watts (13.56 MHz). Thereafter, electrical conductivity of the metal line can be restored and contact resistance can be reduced.

Furthermore, after the copper oxide on the copper line 202 is reduced back to copper, a cleaning solvent can be applied to remove any residual particles.

A conformal barrier layer 212 is formed over the inter-metal dielectric layer 204 and the interior surface of the trench 206 and the contact opening 210. The barrier layer 212 is formed using a material that can prevent copper atoms from diffusing into the inter-metal dielectric layer 204. Consequently, the barrier layer 212 is preferably a tantalum silicide layer formed, for example, by chemical vapor deposition. Because tantalum silicide is very effective in stopping the diffusion of copper atoms, the diffusion of copper atoms into the inter-metal dielectric layer 204 is blocked.

A conformal copper layer 214 is formed over the barrier layer 212. The copper layer 214 serves as a seeding layer for growing a copper layer. The copper layer 214 can be formed, for example, by physical vapor deposition or chemical vapor deposition. Using the inter-metal dielectric layer 204 as a polishing stop layer, the copper layer 214 and the barrier layer 212 above the inter-metal dielectric layer 204 are removed, forming a structure as shown in FIG. 2C.

In the invention, since copper oxide on the surface 202a of the copper line 202 is reduced back to copper by the introduction of $N_2H_2$ gas, voids are no longer formed as in the conventional process. In the absence of voids on the copper line 202, a smooth copper layer 214 conformal to the surface profile of the trench 206 and the contact opening 210 is formed. Hence, seeding layer breakage due to subsequent high-temperature annealing can be prevented.

Figure 2D:
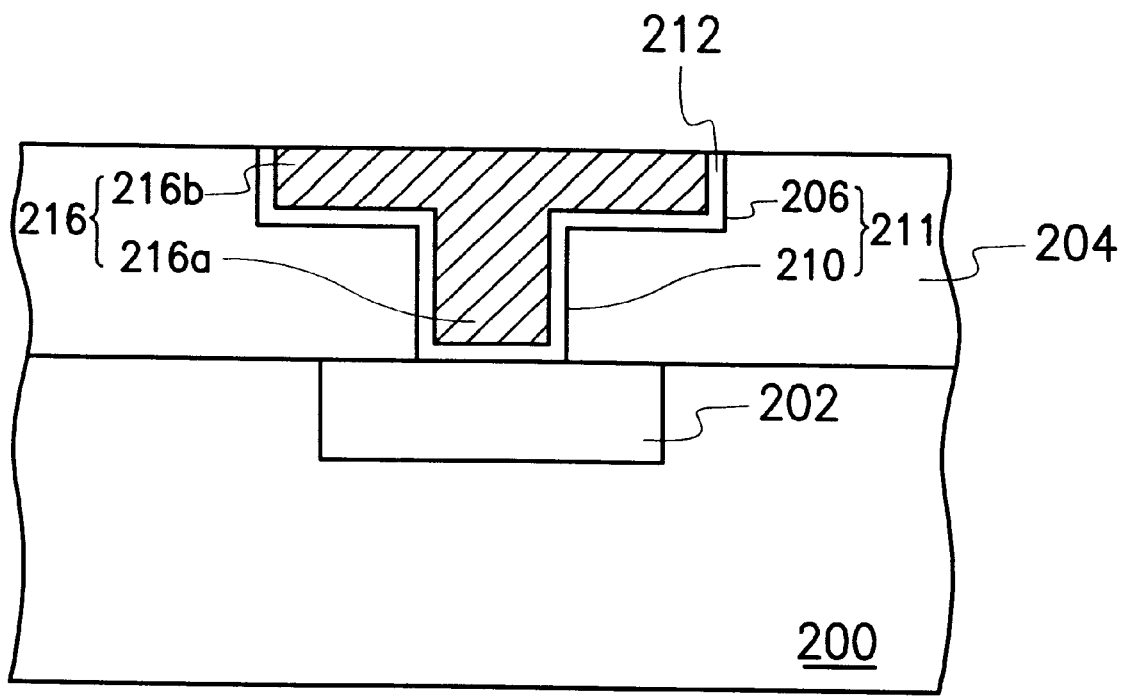

As shown in FIG. 2D, a copper or a copperless electroplating is carried out using the copper layer 214 as a seeding layer. Copper grows anisotropically over the copper layer 214 to form a second copper layer 216 that fills the trench 206 and the contact opening 210. The second copper layer 216 can be regarded as comprising of a trench line 216b and a contact 216a.

Since the seeding copper layer 214 is deposited over the interior surface of the trench 206 and the contact opening 210, the second copper layer 216 grows only in these areas. In other words, no second copper layer 216 forms over the barrier layer 212 during a copper or copperless electroplating due to the absence of seeding copper thereon.

In summary, photoresist material is removed by a low-temperature plasma derived from a gaseous mixture $N_2H_2$ ($H_2$:4%)/$O_2$ so that only small amount of copper oxide is formed. Moreover, the copper oxide is immediately reduced back to copper by the introduction of gaseous $N_2H_2$ ($H_2$:4%). Hence, voids are not formed on the exposed copper line and the subsequent breakage of seeding layer resulting in a lowering of conductivity and an increase in contact resistance is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing metallic interconnects, comprising the steps of:
   providing a substrate having a copper line therein;
   forming a dielectric layer over the substrate and the copper line;
   forming a patterned photoresist layer over the dielectric layer;
   forming a dual damascene opening that exposes a portion of the copper line, wherein the dual damascene opening includes a contact opening and a trench with the contact opening located under the trench;
   removing the photoresist layer using a low-temperature plasma of a gaseous mixture containing $N_2H_2$($H_2$:4%) and $O_2$ so that an amount of oxidation on a surface of the copper line is minimized;
   reducing the copper oxide on the surface of copper line by introducing gaseous $N_2H_2$ ($H_2$:4%) in a non-oxygen ambience;
   forming a conformal barrier layer over the interior surface of the trench and the contact opening;
   forming a first copper layer over the barrier layer inside the trench and the contact opening; and
   growing a second copper layer over the first copper layer inside the trench and the contact opening, wherein the second copper layer includes a trench line and a contact, with the contact located under the trench line.

2. The method of claim 1, wherein flow rates of components of the gaseous mixture containing $N_2H_2$($H_2$:4%) and $O_2$ while removing photoresist material are 100 to 300 sccm for $N_2H_2$ ($H_2$:4%) and 200 to 600 sccm for $O_2$.

3. The method of claim 1, wherein the step of removing the photoresist layer is carried out at a temperature of about 30 to 90° C., a pressure of about 200 to 600 mT, a working power of about 800 to 1300 Watts (2.54 GHz) and a radio frequency (RF) rating of about 100 to 400 Watts (13.56 MHz).

4. The method of claim 1, wherein the step of reducing the copper oxide back to copper is carried out with gaseous $N_2H_2$ is introduced at a rate of about 100 to 300 sccm, a temperature to about 30 to 90° C., a pressure of about 200 to 600 mT, a working power of about 800 to 1300 Watts (2.54 GHz) and a radio frequency (RF) rating of about 100 to 400 Watts (13.56 MHz).

5. The method of claim 1, wherein the step of forming the second copper layer includes copper electroplating using the first copper layer as a seed layer.

6. The method of claim 1, wherein the step of forming the second copper layer includes a copperless electroplating using the first copper layer as a seed layer.

7. The method of claim 1, wherein after the step of reducing the copper oxide back to copper using gaseous $N_2H_2$ ($H_2$:4%) but before forming the barrier layer, further includes cleaning with a solvent.

8. A dual damascene process, comprising the steps of:
   providing a substrate having a metal line therein;
   forming an inter-metal dielectric layer over the metal line and the substrate;
   forming a patterned photoresist layer over the inter-metal dielectric layer;
   forming a dual damascene opening that exposes a portion of the metal line in the inter-metal dielectric layer, wherein the dual damascene opening includes a contact opening and a trench with the contact opening located under the trench;
   removing the photoresist layer using a low-temperature plasma of a gaseous mixture containing $N_2H_2$($H_2$:4%) and $O_2$ so that an amount of oxidation on a surface of the copper line is minimized;
   reducing the copper oxide on the surface of copper line by introducing gaseous $N_2H_2$ ($H_2$:4%) in a non-oxygen ambience;
   forming a conformal barrier layer over an interior surface of the trench and the contact opening;
   forming a conformal seeding layer over the barrier layer inside the trench and the contact opening; and
   growing a metallic layer over the seeding layer inside the trench and the contact opening, wherein the metallic layer includes a trench line and a contact, with the contact located under the trench line.

9. The process of claim 8, wherein flow rates of the components of the gaseous mixture containing $N_2H_2$ ($H_2$:4%) and $O_2$ while removing photoresist material are 100 to 300 sccm for $N_2H_2$ ($H_2$:4%) and 200 to 600 sccm for $O_2$.

10. The process of claim 8, wherein the step of removing the photoresist layer is carried out at a temperature of about 30 to 90° C., a pressure of about 200 to 600 mT, a working power of about 800 to 1300 Watts (2.54 GHz) and a radio frequency (RF) rating of about 100 to 400 Watts (13.56 MHz).

11. The process of claim 8, wherein the step of reducing the copper oxide back to copper is carried our with gaseous $N_2H_2$ is introduced at a rate of about 100 to 300 sccm, a temperature to about 30 to 90° C., a pressure of about 200 to 600 mT, a working power of about 800 to 1300 Watts (2.54 GHz) and a radio frequency (RF) rating of about 100 to 400 Watts (13.56 MHz).

12. The process of claim 8, wherein the seeding layer includes a copper layer.

13. The process of claim 8, wherein the metallic layer includes a copper layer.

14. The process of claim 8, wherein the step of forming the metallic layer includes copper electroplating using the seeding layer as a base.

15. The process of claim 8, wherein the step of forming the metallic layer includes copperless electroplating using the seeding layer as a base.

16. The process of claim 8, wherein the metal line includes a copper line.

17. A method of removing copper oxide formed over the copper line during removing a photoresist layer, comprising the steps of:

providing a substrate having a copper line therein;

forming a dielectric layer over the copper line and the substrate;

forming a patterned photoresist layer over the dielectric layer;

forming a dual damascene opening that exposes a portion of the copper line in the dielectric layer, wherein the dual damascene opening includes a contact opening and a trench, with the contact opening located under the trench;

removing the photoresist layer using a low-temperature plasma of a gaseous mixture containing $N_2H_2(H_2:4\%)$ and $O_2$ so that an amount of copper oxide grown on a surface of the copper line is minimized; and after removing the photoresist layer, reducing the copper oxide on the surface of copper line by introducing gaseous $N_2H_2$ ($H_2:4\%$) in a non-oxygen ambiance.

18. The method of claim 17, wherein flow rates of components of the gaseous mixture containing $N_2H_2$ ($H_2:4\%$) and $O_2$ while removing photoresist material are 100 to 300 sccm for $N_2H_2$ ($H_2:4\%$) and 200 to 600 sccm for $O_2$.

19. The method of claim 17, wherein the step of removing the photoresist layer is carried out at a temperature of about 30 to 90° C., a pressure of about 200 to 600 mT, a working power of about 800 to 1300 Watts (2.54 GHz) and a radio frequency (RF) rating of about 100 to 400 Watts (13.56 MHz).

20. The method of claim 17, wherein the step of reducing the copper oxide on the copper line includes using gaseous $N_2H_2$ ($H_2:4\%$).

21. The method of claim 20, wherein the step of reducing copper oxide back to copper is carried out with gaseous $N_2H_2$ introduced at a rate of about 100 to 300 sccm, a temperature of about 30 to 90° C., a pressure of about 200 to 600 mT, a working power of about 800 to 1300 Watts (2.54 GHz) and a radio frequency (RF) rating of about 100 to 400 Watts (13.56 MHz).

22. A copper damascene process, comprising the steps of:

providing a substrate having a copper line therein;

forming an inter-metal dielectric layer over the copper line and the substrate;

forming a patterned photoresist layer over the inter-metal dielectric layer;

forming a copper damascene opening in the inter-metal dielectric layer, wherein the copper damascene opening includes a contact opening and a trench, with the contact opening located under the trench;

removing the photoresist layer using a low-temperature plasma of a gaseous mixture containing $N_2H_2(H_2:4\%)$ and $O_2$ so that an amount of oxidation on a surface of the copper line is minimized;

reducing the copper oxide on the surface of copper line by passing gaseous $N_2H_2$ ($H_2:4\%$) in a non-oxygen ambience;

forming a conformal barrier layer over the interior surface of the trench and the contact opening;

forming a conformal seeding layer over the barrier layer inside the trench and the contact opening; and growing a copper layer over the seeding layer inside the trench and the contact opening, wherein the copper layer includes a trench line and a contact with the contact is located under the trench line.

23. The method of claim 22, wherein flow rates of components of the gaseous mixture containing $N_2H_2$ ($H_2:4\%$) and $O_2$ while removing photoresist material are 100 to 300 sccm for $N_2H_2$ ($H_2:4\%$) and 200 to 600 sccm for $O_2$.

24. The method of claim 22, wherein the step of removing the photoresist layer is carried out at a temperature of about 30 to 90° C., a pressure of about 200 to 600 mT, a working power of about 800 to 1300 Watts (2.54 GHz) and a radio frequency (RF) rating of about 100 to 400 Watts (13.56 MHz).

25. The method of claim 22, wherein the step of reducing copper oxide back to copper is carried out with gaseous $N_2H_2$ introduced at a rate of about 100 to 300 sccm, a temperature of about 30 to 90° C., a pressure of about 200 to 600 mT, a working power of about 800 to 1300 Watts (2.54 GHz) and a radio frequency (RF) rating of about 100 to 400 Watts (13.56 MHz).

26. The method of claim 22, wherein the seeding layer includes a copper layer.

27. The method of claim 22, wherein the step of forming the copper layer includes copper electroplating using the seeding layer as a base.

28. The method of claim 22, wherein the step of forming the copper layer includes a copperless electroplating using the seeding layer as a base.

29. A method for preventing a copper line from being oxidized during a removal of a photoresist layer from a substrate having the copper line formed thereon, wherein the copper line is exposed by an opening formed in a material layer on the substrate, the method comprising the steps of:

performing a plasma treatment to removed the photoresist layer and suppressing the formation of copper oxide on a surface of the copper line, wherein the plasma treatment is produced by using a gaseous mixture containing $N_2H_2(H_2:4\%)$ and $O_2$ as a source; and after removing the photoresist layer, reducing the copper oxide on the surface of copper line by introducing gaseous $N_2H_2$ ($H_2:4\%$) in a non-oxygen ambiance.

30. The method of claim 29, wherein the step of reducing the copper oxide on the copper line includes using gaseous $N_2H_2$ ($H_2:4\%$).

* * * * *